Aug. 16, 1966 A. T. BURKE 3,266,162
PRODUCTION AID
Filed Feb. 9, 1965
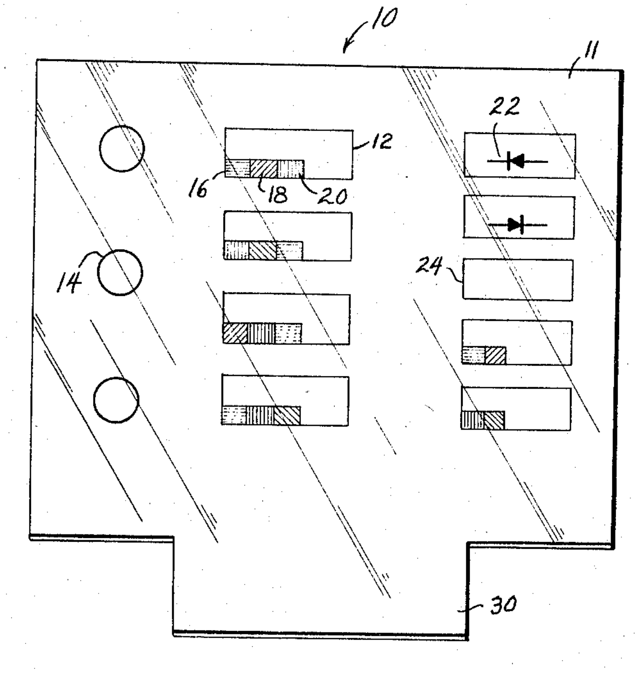
INVENTOR.
ANN T. BURKE
BY
Douglas M. Clarkson
ATTORNEY 3,266,162
Patented August 16, 1966

1

3,266,162

PRODUCTION AID

Ann T. Burke, Bayshore, N.Y., assignor to Potter Instrument Company, Inc., Plainview, N.Y., a corporation of New York Filed Feb. 9, 1965, Ser. No. 431,315
1 Claim. (Cl. 33—174)

This invention, generally, relates to templets and, more particularly, to templets for the checking of component values on printed circuit boards.

It is an object of the present invention to provide a templet to check for production errors in printed circuit boards and to provide a simple and efficient means for checking the values of the components mounted on such boards.

Other objects and advantages of the invention will be pointed out hereinafter in the following detailed description, which may best be understood by reference to the accompanying drawing, the single figure of which is a plan view of a templet in accordance with the present invention.

In the drawing, there is shown a templet 10 for checking the components mounted on printed circuit boards. The templet is fabricated on a transparent plastic body 11, dimensioned to be an exact duplicate of the size of the printed circuit board to be checked.

The position of the components mounted on the boards is outlined as, for example, by the rectangular outline 12 which, for example, are positioned at the location of resistors mounted on the board. Similarly, the outline of circles 14 are imprinted on the templet at the position of transistors mounted on the boards, and if desired, the number of the correct transistor is imprinted at its corresponding circle to provide a prompt visual check.

In order to check the values of the components mounted on a printed circuit board, one-half of the rectangular outline 12 covering the component is imprinted in the same color code as the component. For example, a blue band 16, a green band 18 and a red band 20, indicate the value of the correct component. Thus, when the templet is laid on the finished printed circuit board, any mismatch of colors is immediately apparent, thereby to indicate simply and quickly that a wrong component has been mounted on the board.

Similarly, if the component is not color coded, the electrical symbol as, for example, the diode symbol 22 is imprinted in the component rectangle, or the value of a capacitor is imprinted directly at the rectangle 24 which overlays that component.

2

In this manner, there is provided a templet which can be put down on a finished printed circuit board and which will serve to check the component values on the entire assembled board in a simple and economical manner. With this templet, the time required for check-out of printed circuit etching and component mounting is significantly reduced.

For convenience in use, a short handle 30 is provided on the templet. Each templet must be designed for the specific board and two templets are required for double-sided boards.

This invention may be variously modified and embodied within the scope of the subjoined claim.

What is claimed is:

A templet to check manufactured printed circuit boards which comprises:

a transparent body portion, a plurality of component outlines imprinted on said body portion at the desired positions of components on finished boards, and indicia imprinted on said body portion at the outlines of said components, said indicia including symbols which match symbols on said components, so that a mismatch is readily observable to indicate the mounting of the wrong component, and a plurality of color bands imprinted on said body portion within preselected ones of said outlines, said color bands covering part of said component outlines and positioned to register with color bands on coded components for checking the correctness of the value of said components.

References Cited by the Examiner

UNITED STATES PATENTS

| | | | |
|---|---|---|---|
| 1,166,895 | 1/1916 | Flora | 33—1 |
| 2,246,700 | 6/1941 | Smith | 33—48.1 |
| 2,270,158 | 1/1942 | Bassgen et al. | 33—174 |
| 2,497,200 | 2/1950 | Appel | 35—48.1 |
| 2,720,028 | 10/1955 | Wolf | 33—1 |
| 2,882,618 | 4/1959 | Thompson | 35—19.1 |
| 3,137,815 | 6/1964 | Hershey | 33—19.1 |
| 3,152,405 | 10/1964 | Halisky | 33—19.1 |

LEONARD FORMAN, *Primary Examiner.*

ROBERT B. HULL, *Examiner.*

B. DONAHUE, S. S. MATTHEWS, *Assistant Examiners.*